US006847664B2

(12) United States Patent
Le Gall et al.

(10) Patent No.: US 6,847,664 B2
(45) Date of Patent: Jan. 25, 2005

(54) OPTICAL DEVICE WITH WAVELENGTH MONITOR

(75) Inventors: Franck Le Gall, Paris (FR); Daniel Mousseaux, St-Arnoult-en-Yvelines (FR)

(73) Assignee: Avanex Corporation, Fremont, CA (US)

( * ) Notice: Subject to any disclaimer, the term of this patent is extended or adjusted under 35 U.S.C. 154(b) by 44 days.

(21) Appl. No.: 10/163,433

(22) Filed: Jun. 7, 2002

(65) Prior Publication Data

US 2003/0007233 A1 Jan. 9, 2003

(30) Foreign Application Priority Data

Jun. 8, 2001 (EP) .......................................... 01 440 161

(51) Int. Cl.⁷ ................................................ H01S 3/04
(52) U.S. Cl. .......................................... 372/34; 372/36
(58) Field of Search ..................................... 372/34–36

(56) References Cited

U.S. PATENT DOCUMENTS

| | | | | |
|---|---|---|---|---|
| 5,446,750 A | * | 8/1995 | Ohtsuka et al. ................ | 372/34 |
| 5,848,092 A | * | 12/1998 | Mitsumoto et al. .......... | 372/107 |
| 6,005,995 A | | 12/1999 | Chen et al. | |
| 6,272,157 B1 | * | 8/2001 | Broutin et al. ................. | 372/32 |
| 6,327,287 B1 | * | 12/2001 | Kner et al. .................... | 372/43 |
| 6,488,419 B2 | * | 12/2002 | Kato et al. ..................... | 385/93 |
| 6,529,534 B1 | * | 3/2003 | Yasuda ......................... | 372/32 |
| 6,584,129 B2 | * | 6/2003 | Hyuga et al. .................. | 372/39 |
| 6,597,712 B2 | * | 7/2003 | Tatsuno et al. ................ | 372/32 |
| 6,667,998 B1 | * | 12/2003 | Lo et al. ........................ | 372/34 |
| 2002/0154428 A1 | * | 10/2002 | Nasu et al. ................... | 359/892 |
| 2003/0012250 A1 | * | 1/2003 | Shirasaki ...................... | 372/98 |

FOREIGN PATENT DOCUMENTS

| | | |
|---|---|---|
| EP | 0 310 000 A2 | 4/1989 |
| JP | 10 223960 | 8/1998 |

OTHER PUBLICATIONS

Patent Abstracts of Japan, vol. 1998, No. 13, Nov. 30, 1998 corresponding to JP 10 221669 (Yazaki Corp . . . ) dated Aug. 21, 1998.
Patent Abstracts of Japan, vol. 016, No. 497 (E–1279) Oct. 14, 1992, corresponding to JP 04 181787 A (Mitsubishi Electric Corp) dated Jun. 29, 1992.
Patent Abstracts of Japan, vol. 13, No. 312 (E–788) Jul. 17, 1989 corresponding to JP 01 084766 A Matsushita Electric Ind. Co. Ltd) dated Mar. 30, 1989.
M. Shirasaki, "Temperature of Fabry–Perot Etalon", IEEE Photonics Technology Letters, IEEE, Inc., NY, vol. 11, No. 11 Nov. 1999, pp. 1431–1433, XP000893781.

* cited by examiner

Primary Examiner—Don Wong
Assistant Examiner—Philip Nguyen
(74) Attorney, Agent, or Firm—Moser, Patterson & Sheridan, L.L.P.

(57) ABSTRACT

The invention is related to an optical device having a housing (1) with a defined gas atmosphere. The housing includes a wavelength monitor, for monitoring an optical signal The wavelength monitor includes an etalon (2) with a gap between two etalon plates. The optical device also has a laser diode and means for influencing the temperature (3) of the laser diode. The optical device further includes special means to influence the gas density in the gap between the etalon plates.

4 Claims, 3 Drawing Sheets

OPTICAL DEVICE WITH WAVELENGTH MONITOR

CROSS REFERENCE TO RELATED APPLICATIONS

This application claims priority to European patent application 01440161.6, filed on Jun. 8, 2001.

BACKGROUND OF THE INVENTION

The invention is related to an optical device with a wavelength monitor for a WDM system, with an etalon and at least one other opto electronic component in a housing, with means for influencing the temperature of at least one of the opto electronic components, with a defined gas atmosphere in the housing.

WDM methods are increasingly being used in optical transmission systems. In such methods a number of modulated optical carriers with differing frequencies are transmitted simultaneously in a glass fiber. Each of these carriers forms a channel, which is logically independent of the carriers, each channel being fed by one laser. To increase the transmission capacity, the number of channels of WDM transmission systems is increasingly being enlarged, the frequency spacing and thus also the wavelength spacing being increasingly reduced. In present-day transmission systems with so-called dense WDM (DWDM), referred to in the following as DWDM transmission systems, for example 16 channels are transmitted with an equidistant frequency spacing of 100 GHz. To further increase the transmission capacity, in accordance with the International Telecommunication Union (ITU) it is proposed that this frequency spacing be halved to 50 GHz. However, with decreasing frequency spacing, the demands on the accuracy and stability of the wavelengths emitted by the laser diodes, also referred to in the following as ITU wavelengths, become greater. The ITU permits a wavelength deviation of a maximum 10% of the wavelength spacing between two adjacent channels, also referred to in the following as ITU wavelength spacing.

The wavelength of a laser diode, abbreviated to laser in the following, is a function of its temperature. With the aid of a controllable laser heating unit, this temperature is set such that the desired wavelength is emitted. For this purpose, with the aid of a wavelength monitor, a wavelength-dependent error signal is generated, from which a suitable control signal is formed for controlling the laser heating unit.

Wavelength monitors comprise in their optical part an etalon structure. Air-gap etalons, used in common wavelength monitors, are made from two plates 20, usually made from fused silica, with mirror coatings 30 on each of them. At least one spacer 10 made with a material that has a very low coefficient of thermal expansion separates the plates from each other, as described in FIG. 1. The refractive index of the Fabry-Perot cavity is the one of the gas enclosed between the 2 mirror plates.

A Wavelength monitor is disclosed in document U.S. Pat. No. 6,005,995. In the wavelength monitor, a splitter in two optical branches splits the fed-in laser light; in the first optical branch the light is directly fed to a first photodiode, while the light in the second optical branch passes through a wavelength filter before striking a second photodiode. While the first photodiode of the wavelength monitor supplies a current, which is proportional to the intensity of the fed-in laser light independently of the wavelength, the second photodiode supplies a current periodic with the wavelength. Forming the difference between the output currents of the photodiodes generates the error signal for example. In order that all the lasers of a DWDM transmission system can each be set at a ITU wavelength with the aid of a wavelength monitor, the period spacing, also known as the free spectral range (FSR), of the wavelength filter must correspond exactly to the ITU wavelength spacing. To achieve in each case an unequivocal setting of the lasers at a specific ITU wavelength, it must be ensured that, before the wavelength control comes into effect, the emission of each laser always falls within a specific wavelength range.

Lasers undergo a shift in the emitted wavelength due to aging. The capture range should therefore be sufficiently large to ensure that the emitted wavelength still falls in the capture range even after aging. If the capture range is too small, the risk exists that after a certain period of time the wavelength will be outside the capture range and therefore can no longer be set at the provided ITU wavelength.

The high precision of laser monitors and therefore lasers requests also a temperature stabilization of the total device and especially for the wavelength monitor.

Wavelength monitors consist of the optical part with an etalon structure and an electronic circuit for measuring the actual wavelength and deriving the electronic control signal. In the further description, "wavelength monitor" describes the etalon structure without showing the electronic circuit.

When a gas is at moderate pressure and temperature, the refractive index n of a gas is given from the Gladstone-Dale approximation of the Lorentz-Lorenz and the perfect gas law, $$n = 1 + \mu \frac{P}{T} \qquad (1)$$

Where $\mu$ is a constant that depends on the nature of the gas
P is the pressure of the gas
T is the temperature of the gas This means that the refractive index is proportional to the gas density.

The sensitivity of the transmitted wavelength versus the refractive index n of the air-gap cavity is given by:

$$\frac{d\lambda}{dn} = \frac{\lambda}{n} \qquad (2)$$

To ensure the stability of the wavelength monitor, it is necessary to ensure the stability of the refractive index n, inside the air-gap cavity, over the operating conditions. Two solutions to solve this problem are mentioned in document U.S. Pat. No. 6,005,995.

The first solution uses solid etalons instead of air-gap etalons. These etalons are made with a fused silica plate, covered on both sides by mirror coatings. Since there is no air-gap, there is no sensitivity to gas density. The counterpart is that fused silica (or other materials) exhibits great variation of the refractive index versus temperature. The solid etalons will then exhibit a great sensitivity with the Peltier cooler temperature that is not compatible with required stability.

The second one uses a vacuum-gap etalon that is hermetically closed to keep vacuum condition after the use of a vacuum pump. Thus, the density of the gas in the gap won't change. This solution is not good enough since such a sealed etalon is too difficult to manufacture and too big to be incorporated in standard packages.

Thus, there is a need to o build integrated opto electronical devices wavelength monitors mounted together with laser diodes in one housing hermetically closed ALCATEL Product 1935 TLI which is a tuneable high power continuous laser with integrated wavelength monitoring corresponds to such a package.

The diode has to be thermally stabilized so the laser diode and wavelength monitor is mounted on a Peltier cooler as shown in FIG. 2. FIG. 2 shows the housing 1 and the wavelength monitor 2. The wavelength monitor 2 is mounted on a Peltier cooler 3.

Nevertheless, cooling the wavelength monitor and the laser diode we have different temperatures between the air-gap etalon and the package. The volume of gas that is close to the etalon won't have the same density that the gas that is close to the package. This means that the refractive index of the gas, inside the air-gap cavity, will change when the difference between package temperature and etalon temperature changes.

For example we consider first that the integrated wavelength monitor whose both etalon and package temperatures are equal to 20° C. We then heat up the package temperature while keeping etalon temperature constant. The density of the gas, close to the package will decrease, whereas the density of the gas, inside the air-gap cavity will increase. This will cause an increase in the transmitted wavelength of the air-gap Fabry-Perot.

SUMMARY OF THE INVENTION

The device related to the invention allows to reduce the effect of different gas densities in between the mirror plates of the FP etalon of an integrated wavelength monitoring up to a point where the system is temperature stable.

The invention provides an optical device comprising, in an housing with a defined gas atmosphere:
- a wavelength monitor, for monitoring an optical signal, including an etalon with a gap between two etalon plates,
- at least one other opto electronic component,
- and means for influencing the temperature of at least one of the opto electronic components,
- characterized in that said housing further includes at least one additional mean for influencing the gas density in said gap between said etalon plates.

This solves the problem to ensure that the gas density inside the etalon gap does not change while the temperature of the Peltier cooler or the temperature of the package changes.

With the embodiments of the invention the problem is solved that the gas temperature, inside the air-gap cavity, is closer to the etalon temperature than it is to the package temperature. The basic idea is then to modify the mounting in order to modify the gas temperature, inside the air-gap, when the package temperature is changed. This temperature compensation has to be done in such a way that the gas density, inside the air-gap cavity, doesn't move over all the operating temperatures.

More details can be derived from the following detailed description of the invention.

DESCRIPTION OF THE INVENTION

Figure 1:
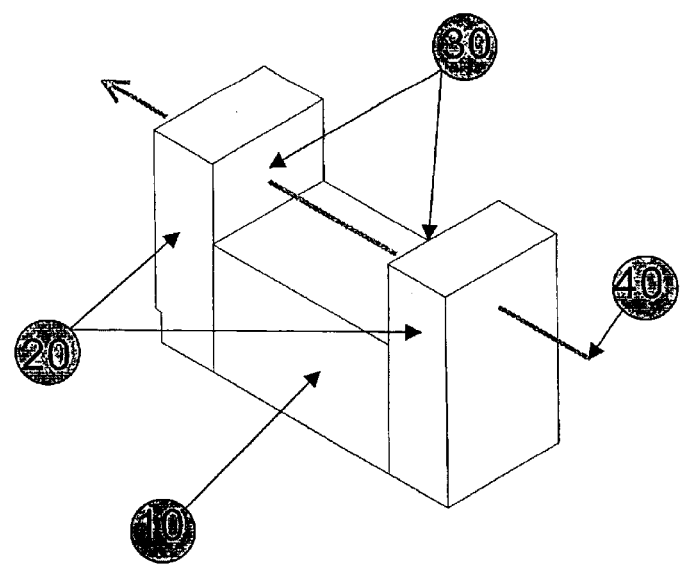
FIG. 1: shows the schematic etalon arrangement of a wavelength monitor.
Figure 2:
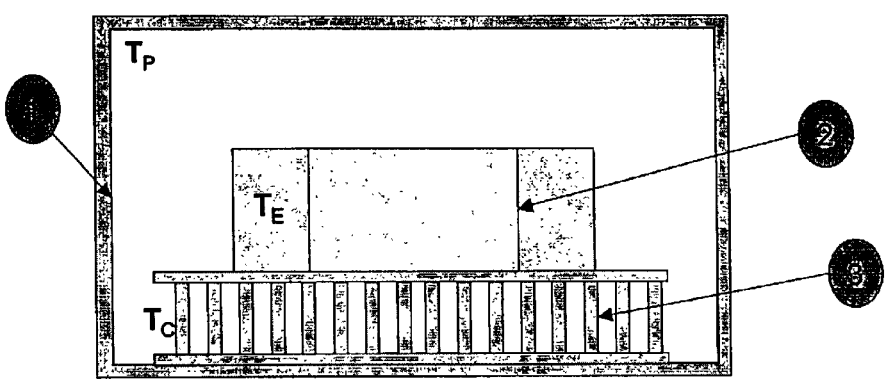
FIG. 2: shows the mounting in prior art
Figure 3:
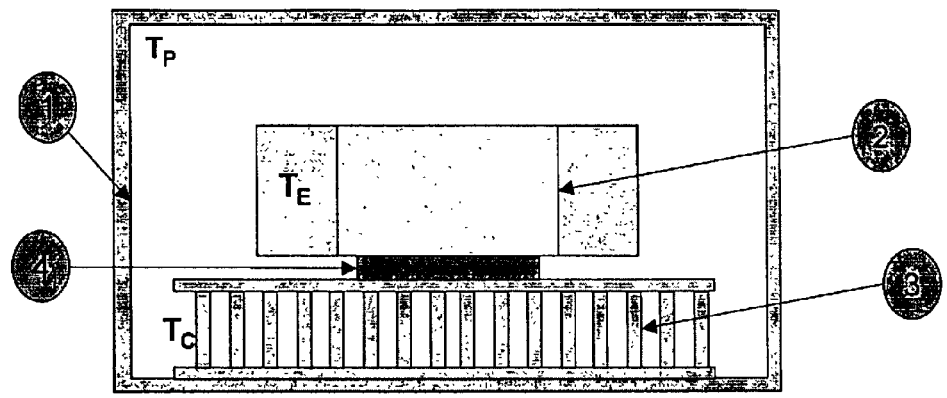
FIG. 3 shows a first embodiment of the invention

In FIG. 3, the wavelength monitor is mounted on a Peltier cooler 3 in a common housing 1. A heat insulator 4 is mounted between the air-gap etalon 2 and the cooler.

The laser diode is not shown in the schematic figure. This additional opto electronic component is also mounted on the Peltier cooler 3 to be wavelength shifted by different temperatures.

Any increase (res. decrease) in the package temperature brings an increase (res. decrease) of the etalon temperature greater that the one that would be obtained without the thermal insulator. The gas density increase, inside the air-gap cavity, is then lower and the thermal stability is better.

Figure 4:
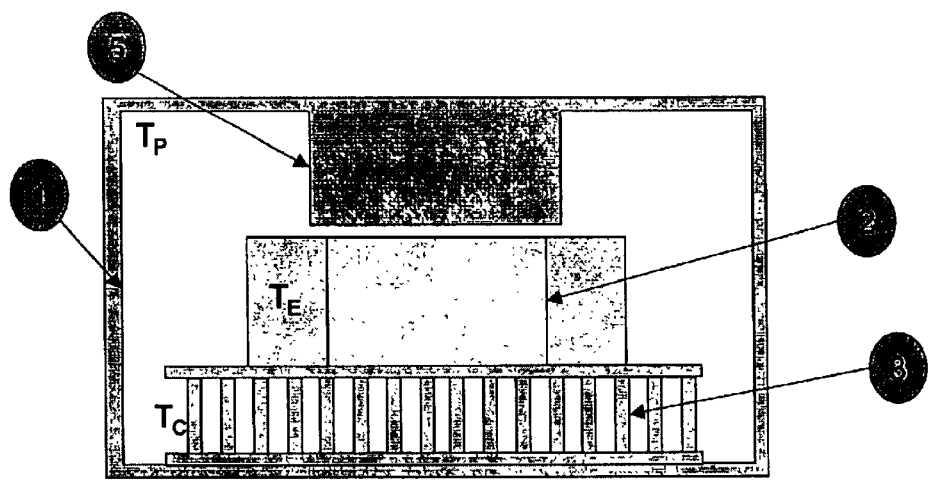
FIG. 4 shows a second embodiment of the invention

In FIG. 4 a heat conductive post 5, connected to the package, is brought near the air-gap cavity. The post heats up the gas inside the air-gap cavity when the package is heated up. The gas density increase, inside the air-gap cavity, then is lower and the thermal stability is better.

The heat conductive post added to the housing of the device has a shape that helps to stabilize the gas density. Possible shapes are a parallelepiped, a spherical segment and any other shape that helps to achieve the thermal requests.

Figure 5:
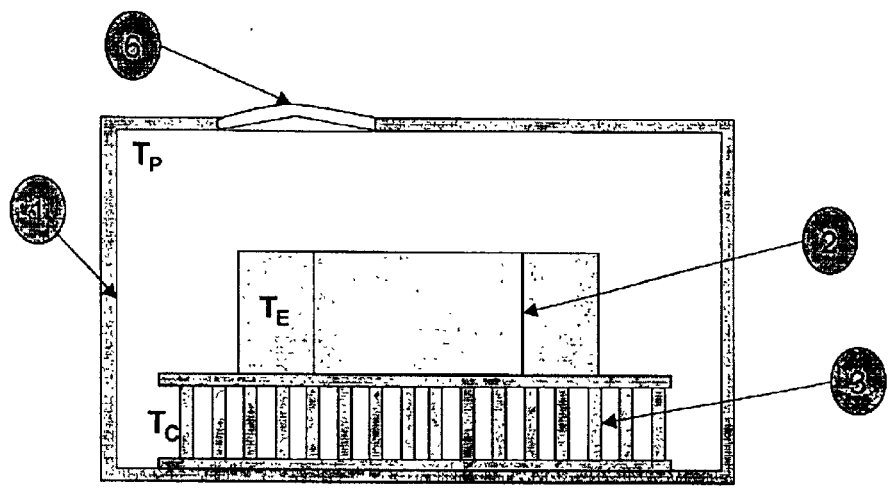
FIG. 5 shows a third embodiment of the invention.

In FIG. 5, a flexible part 6 is added to the package. Bending of the flexible part will then compensate the increase in gas pressure, brought by package temperature increase. This will then decrease the gas density modification and increase the thermal stability.

Figure 6:
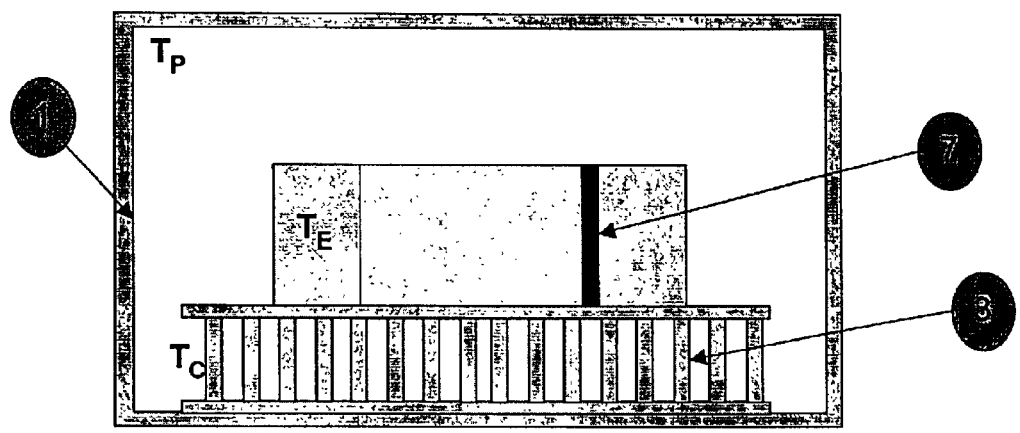
FIG. 6 shows a fourth embodiment of the invention.

In FIG. 6, a small heater 7 is mounted on the etalon. The etalon is then heated up when the package temperature increases. In this case, the etalon heating needs to be electronically controlled.

In another embodiment of the invention the single means to influence the gas density are combined together, for example the thermal isolator and the conductive post, the flexible part and the heating element etc.

What is claimed is:

1. An optical device comprising:
    a housing with a defined gas atmosphere having a wavelength monitor for monitoring an optical signal, the wavelength monitor comprising an etalon with a gap between two etalon plates;
    a laser diode;
    means for influencing the temperature of said laser diode; and
    a heat insulator, coupled between the etalon and the influencing means, for influencing the gas density in said gap between said two etalon plates.

2. An optical device comprising:
    a housing with a defined gas atmosphere having a wavelength monitor for monitoring an optical signal, the housing having a top piece and a bottom piece, the wavelength monitor comprising an etalon, coupled over a Peltier cooling element, with a gap between two etalon plates;
    the Peltier cooling element, coupled over the bottom piece of the housing, for influencing the temperature of a laser diode; and a conductive post, coupled underneath the top piece of the housing, for influencing the gas density in said gap between said two etalon plates.

3. An optical device comprising:

a housing with a defined gas atmosphere having a wavelength monitor for monitoring an optical signal, the housing having a top piece and a bottom piece, the wavelength monitor comprising an etalon, coupled over a Peltier cooling element, with a gap between two etalon plates;

the Peltier cooling element, coupled over the bottom piece of the housing, for influencing the temperature of a laser diode; and a flexible part designed as part of the top piece of the housing, the flexible part compensating for an increase in gas pressure as the temperature increases in said gap between said two etalon plates.

4. An optical device comprising:

a housing with a defined gas atmosphere having a wavelength monitor for monitoring an optical signal, the housing having a top piece and a bottom piece, the wavelength monitor comprising an etalon, coupled over a Peltier cooling element, with a gap between two etalon plates;

the Peltier cooling element, coupled over the bottom piece of the housing, for influencing the temperature of a laser diode; and a heater mounted as part of the etalon which heats up the etalon for influencing the gas density in said gap between said two etalon plates.

* * * * *